United States Patent
Edwards

(10) Patent No.: US 10,777,854 B2
(45) Date of Patent: Sep. 15, 2020

(54) DETERMINING BATTERY DEPLETION FOR COORDINATING BATTERY REPLACEMENT

(71) Applicant: Itron Networked Solutions, Inc., San Jose, CA (US)

(72) Inventor: Bruce Edwards, San Jose, CA (US)

(73) Assignee: Itron Networked Solutions, Inc., San Jose, CA (US)

(*) Notice: Subject to any disclaimer, the term of this patent is extended or adjusted under 35 U.S.C. 154(b) by 403 days.

(21) Appl. No.: 15/890,085

(22) Filed: Feb. 6, 2018

(65) Prior Publication Data

US 2018/0226697 A1    Aug. 9, 2018

Related U.S. Application Data

(60) Provisional application No. 62/455,141, filed on Feb. 6, 2017.

(51) Int. Cl.

| | |
|---|---|
| H02J 7/00 | (2006.01) |
| H01M 10/48 | (2006.01) |
| H01M 10/44 | (2006.01) |
| G01R 31/367 | (2019.01) |
| G01R 31/3835 | (2019.01) |
| H01M 10/0525 | (2010.01) |
| H01M 16/00 | (2006.01) |
| H01M 6/14 | (2006.01) |
| H02J 7/34 | (2006.01) |
| H02J 13/00 | (2006.01) |

(52) U.S. Cl.
CPC ........ *H01M 10/482* (2013.01); *G01R 31/367* (2019.01); *G01R 31/3835* (2019.01); *H01M 6/14* (2013.01); *H01M 10/0525* (2013.01); *H01M 10/44* (2013.01); *H01M 10/48* (2013.01); *H01M 16/00* (2013.01); *H02J 7/342* (2020.01); *H02J 7/0029* (2013.01); *H02J 7/00306* (2020.01); *H02J 13/0075* (2013.01)

(58) Field of Classification Search
USPC ...................................... 320/103
See application file for complete search history.

(56) References Cited

U.S. PATENT DOCUMENTS 9,432,259 B1 * 8/2016 Hutz ............. H04L 41/0836
10,149,141 B1 * 12/2018 Stamatakis ....... H04L 41/0806
(Continued)

*Primary Examiner* — Alexis B Pacheco
(74) *Attorney, Agent, or Firm* — Artegis Law Group, LLP

(57) ABSTRACT

A power system within a battery-powered node includes a primary cell, a secondary cell, and a battery controller. The battery controller includes a constant current source that draws power from the primary cell to charge the secondary cell. The battery-powered node draws power from the secondary cell across a wide range of current levels. When the voltage of the secondary cell drops beneath a minimum voltage level, the constant current source charges the secondary cell and a charging signal is sent to the battery-powered node. When the voltage of the second cell exceeds a maximum voltage level, the constant current source stops charging the secondary cell and the charging signal is terminated. The battery-powered node records the amount of time the charging signal is active and then determines a battery depletion level based on that amount of time. Battery replacement may then be efficiently scheduled based on the depletion level.

20 Claims, 5 Drawing Sheets

(56) References Cited

U.S. PATENT DOCUMENTS

2014/0273940 A1\* 9/2014 Hyde .................. H04W 4/24
 455/406
2016/0219516 A1\* 7/2016 Subramanian .... H04W 52/0219

\* cited by examiner

DETERMINING BATTERY DEPLETION FOR COORDINATING BATTERY REPLACEMENT

CROSS-REFERENCE TO RELATED APPLICATIONS

This application claims the benefit of United States provisional patent application titled, "Battery Current Consumption Measurement," filed on Feb. 6, 2017 and having Ser. No. 62/455,141. The subject matter of this related application is hereby incorporated herein by reference.

BACKGROUND OF THE INVENTION

Field of the Invention

Embodiments of the present invention relate generally to wireless network communications and, more specifically, to determining battery depletion for coordinating battery replacement.

Description of the Related Art

A conventional wireless mesh network includes a plurality of nodes configured to communicate with one another. In certain types of heterogeneous wireless mesh networks, both continuously-powered nodes and battery-powered nodes communicate and interact with one another within the mesh network. Typically, continuously-powered nodes are coupled to a power grid and have continuous access to power (except during power outages). Battery-powered nodes, on the other hand, operate with batteries that provide only a finite supply of power. To conserve power, battery-powered nodes may deactivate for long periods of time, during which little power is consumed, and then reactivate for short periods of time, during which very brief network communications are performed. With this approach, a battery-powered node may operate with a single battery for an extended period of time. When the battery eventually becomes depleted, though, a service technician has to be dispatched to replace the battery.

Service technicians usually attempt to predict when battery-powered nodes will need replacement batteries based on a model of node power consumption. This approach confers at least two benefits. First, service technicians can replace depleted batteries before those batteries are predicted to expire, thereby minimizing or eliminating node downtime and preserving network stability. Second, service technicians can consolidate battery replacement assignments to occur on days when multiple nodes are predicted to need replacement batteries, thereby minimizing truck rolls.

That said, conventional battery-powered nodes usually consume power in an unpredictable manner due to the activation/reactivation behavior described above. Therefore, predictions based on modeling, as discussed above, are oftentimes inaccurate. To address this problem, battery-powered nodes can be equipped with battery monitors that report battery usage data to service technicians. Based on this usage data, service technicians can more efficiently schedule battery replacement assignments. However, implementing battery monitors with battery-powered nodes that operate over an extended period of time has at least two drawbacks. First, a battery-powered node that operates according to the activation/deactivation schedule discussed above typically consumes power over a wide range of currents during the short reactivation periods. Power consumed over a wide range of currents cannot be measured accurately using a conventional battery monitor. Second, conventional battery monitors typically consume too much additional battery power, which can reduce the operational lifetime of a battery-powered node below an acceptable timespan.

As the foregoing illustrates, what is needed in the art is a more effective way to determine battery depletion in power battery-powered nodes within a wireless mesh network.

SUMMARY OF THE INVENTION

One embodiment of the present invention sets forth a computer-implemented method for determining battery depletion in a battery-powered node residing within a wireless mesh network, including determining that a first voltage level associated with a secondary cell is less than a minimum voltage level, in response, activating a charging signal, conducting first electrical energy from a primary cell to the secondary cell at a constant current level in response to the charging signal, where the battery-powered node draws second electrical energy from the secondary cell, and causing the battery-powered node to record a first amount of time for which the charging signal is active, wherein the first amount of time indicates a first amount of battery power stored in the primary cell.

At least one advantage of the techniques described herein is that battery depletion can be reliably determined in battery-powered nodes with extended operational lifetimes. Accordingly, the need to replace the batteries in a given battery-powered node can be predicted with precision

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

As discussed above, battery-powered nodes that operate according to a punctuated activation/deactivation schedule oftentimes consume power over a wide range of current levels. Conventional battery monitors cannot accurately measure power consumption over this wide range of currents. Further, conventional battery monitors consume excessive power and therefore may reduce the operational lifetime of the battery-powered node below an acceptable timespan.

To address these issues, embodiments of the invention include a battery-powered node that draws power from a power system. The power system includes a primary cell and a secondary cell managed by a battery controller. The battery controller includes a constant current source that draws power from the primary cell to charge the secondary cell. The secondary cell powers the battery-powered node, which may draw power across a wide range of current levels. When the voltage of the secondary cell drops beneath a minimum voltage level, the constant current source charges the secondary cell and a charging signal is sent to the battery-powered node. When the voltage of the second cell exceeds a maximum voltage level, the constant current source stops charging the secondary cell and the charging signal is terminated. The battery-powered node records the amount of time the charging signal is active and then determines a battery depletion level based on that amount of time. The battery-powered node reports the depletion level across the network, thereby allowing battery replacement to be efficiently scheduled.

One advantage of the techniques described herein is that the battery controller can reliably indicate battery depletion in battery-powered nodes with extended operational lifetimes. Accordingly, the need to replace the batteries in a given battery-powered node can be predicted with precision. With such precision, service technicians can more effectively schedule battery replacements in a manner that minimizes node downtime and minimizes truck rolls. Another advantage of the techniques described herein is that the battery controller consumes minimal power and therefore does not significantly reduce the operational lifespan of the battery powered node. For these reasons, the disclosed approach represents a significant technical advancement.

System Overview

Figure 1:
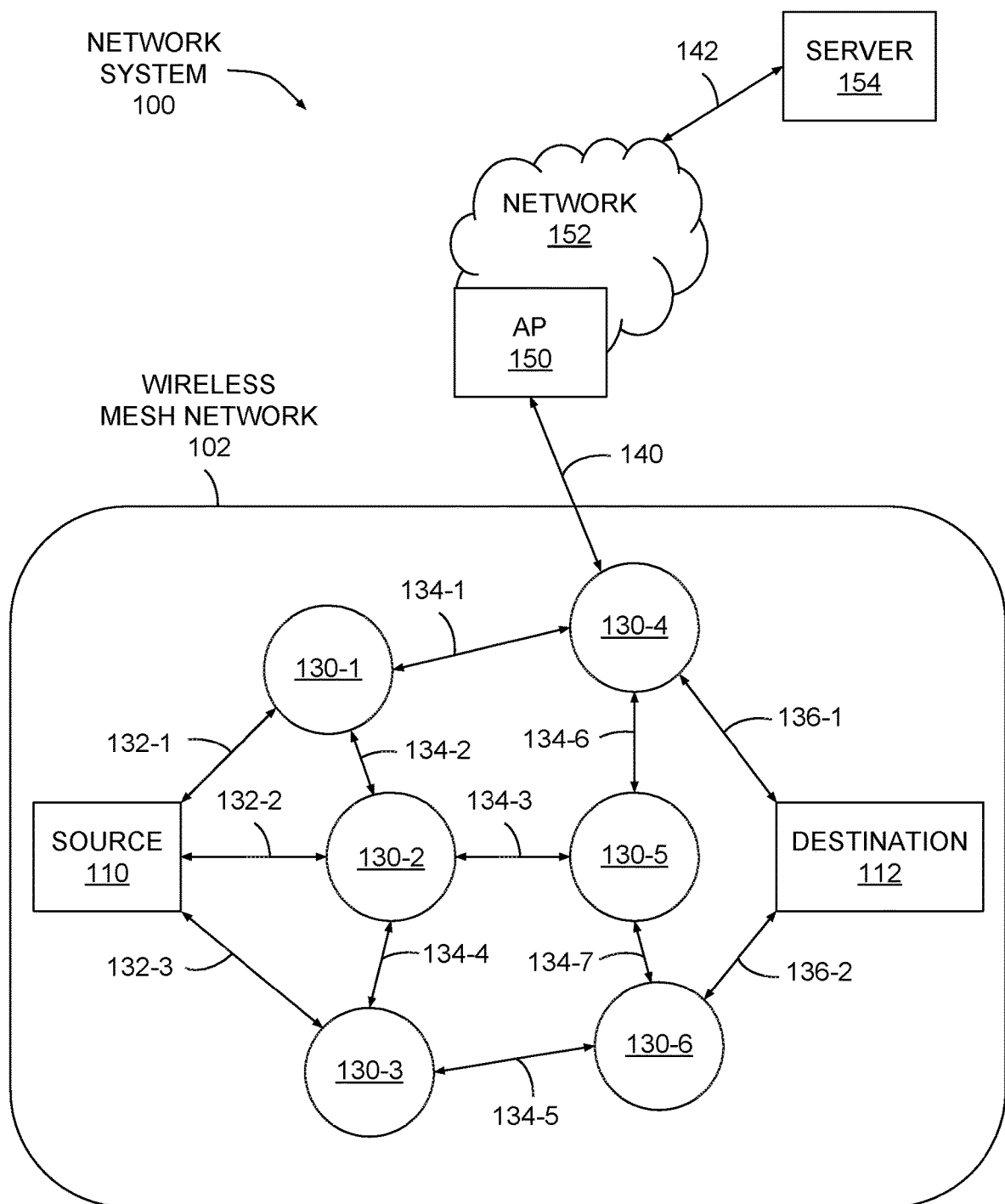
FIG. 1 illustrates a network system configured to implement one or more aspects of the present invention.

FIG. 1 illustrates a network system configured to implement one or more aspects of the present invention. As shown, the network system 100 includes a wireless mesh network 102, which may include a source node 110, intermediate nodes 130 and destination node 112. The source node 110 is able to communicate with certain intermediate nodes 130 via communication links 132. The intermediate nodes 130 communicate among themselves via communication links 134. The intermediate nodes 130 communicate with the destination node 112 via communication links 136. The network system 100 may also include an access point 150, a network 152, and a server 154. A given node 130 may be a continuously-powered device that is coupled to a power grid, or a battery-powered device that included one or more internal batteries.

A discovery protocol may be implemented to determine node adjacency to one or more adjacent nodes. For example, intermediate node 130-2 may execute the discovery protocol to determine that nodes 110, 130-1, 130-3, and 130-5 are adjacent to node 130-2. Furthermore, this node adjacency indicates that communication links 132-2, 134-2, 134-4 and 134-3 may be established between the nodes 110, 130-1, 130-3, and 130-5, respectively. Any technically feasible discovery protocol may be implemented without departing from the scope and spirit of embodiments of the present invention.

The discovery protocol may also be implemented to determine the hopping sequences of adjacent nodes, i.e. the sequence of channels across which nodes periodically receive payload data. As is known in the art, a "channel" may correspond to a particular range of frequencies. Once adjacency is established between the source node 110 and at least one intermediate node 130, the source node 110 may generate payload data for delivery to the destination node 112, assuming a path is available. The payload data may comprise an Internet protocol (IP) packet, or any other technically feasible unit of data. Similarly, any technically feasible addressing and forwarding techniques may be implemented to facilitate delivery of the payload data from the source node 110 to the destination node 112. For example, the payload data may include a header field configured to include a destination address, such as an IP address or media access control (MAC) address.

Each intermediate node 130 may be configured to forward the payload data based on the destination address. Alternatively, the payload data may include a header field configured to include at least one switch label to define a predetermined path from the source node 110 to the destination node 112. A forwarding database may be maintained by each intermediate node 130 that indicates which communication link 132, 134, 136 should be used and in what priority to transmit the payload data for delivery to the destination node 112. The forwarding database may represent multiple routes to the destination address, and each of the multiple routes may include one or more cost values. Any technically feasible type of cost value may characterize a link or a route within the network system 100, although one specific approach is discussed in greater detail below in conjunction with FIGS. 3A-5. In one embodiment, each node within the wireless mesh network 102 implements similar functionality and each node may act as a source node, destination node or intermediate node.

In network system 100, the access point 150 is configured to communicate with at least one node within the wireless mesh network 102, such as intermediate node 130-4. Communication may include transmission of payload data, timing data, or any other technically relevant data between the access point 150 and the at least one node within the wireless mesh network 102. For example, communications link 140 may be established between the access point 150 and intermediate node 130-4 to facilitate transmission of payload data between wireless mesh network 102 and network 152. The network 152 is coupled to the server 154 via communications link 142. The access point 150 is coupled to the network 152, which may comprise any wired, optical, wireless, or hybrid network configured to transmit payload data between the access point 150 and the server 154.

In one embodiment, the server 154 represents a destination for payload data originating within the wireless mesh network 102 and a source of payload data destined for one or more nodes within the wireless mesh network 102. In one embodiment, the server 154 is a computing device, including a processor and memory, and executes an application for interacting with nodes within the wireless mesh network 102. For example, nodes within the wireless mesh network 102 may perform measurements to generate measurement data, such as power consumption data. The server 154 may execute an application to collect the measurement data and report the measurement data. In one embodiment, the server 154 queries nodes within the wireless mesh network 102 for certain data. Each queried node replies with requested data, such as consumption data, system status and health data, and so forth. In an alternative embodiment, each node within the wireless mesh network 102 autonomously reports certain data, which is collected by the server 154 as the data becomes available via autonomous reporting.

The techniques described herein are sufficiently flexible to be utilized within any technically feasible network environment including, without limitation, a wide-area network (WAN) or a local-area network (LAN). Moreover, multiple network types may exist within a given network system 100. For example, communications between two nodes 130 or between a node 130 and the corresponding access point 150 may be via a radio-frequency local-area network (RF LAN), while communications between access points 150 and the network may be via a WAN such as a general packet radio service (GPRS). As mentioned above, each node within wireless mesh network 102 includes a network interface that enables the node to communicate wirelessly with other nodes. Each node 130 may implement any and all embodiments of the invention by operation of the network interface. An exemplary network interface is described below in conjunction with FIG. 2.

Figure 2:
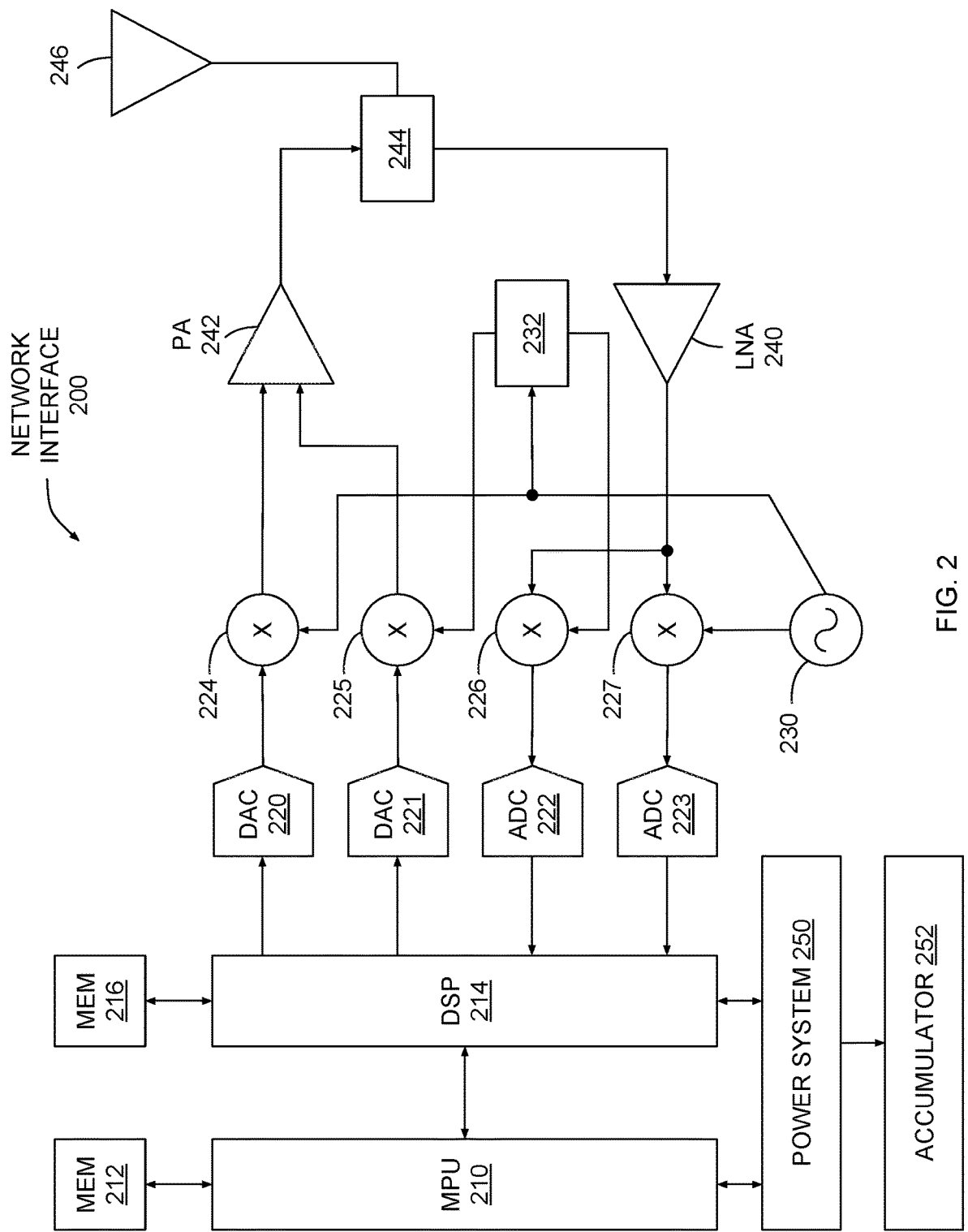
FIG. 2 illustrates a network interface configured to transmit and receive data within the mesh network of FIG. 1, according to various embodiments of the present invention.

FIG. 2 illustrates a network interface configured to transmit and receive data within the mesh network of FIG. 1, according to various embodiments of the present invention. Each node 110, 112, 130 within the wireless mesh network 102 of FIG. 1 includes at least a portion of the network interface 200. As shown, the network interface 200 includes, without limitation, a microprocessor unit (MPU) 210, a digital signal processor (DSP) 214, digital to analog converters (DACs) 220, 221, analog to digital converters (ADCs) 222, 223, analog mixers 224, 225, 226, 227, a phase shifter 232, an oscillator 230, a power amplifier (PA) 242, a low noise amplifier (LNA) 240, an antenna switch 244, an antenna 246, and a power system 250. Oscillator 230 may be coupled to a clock circuit (not shown) configured to maintain an estimate of the current time. MPU 210 may be configured to update this time estimate, and other data associated with that time estimate.

A memory 212 may be coupled to the MPU 210 for local program and data storage. Similarly, a memory 216 may be coupled to the DSP 214 for local program and data storage. Memory 212 and/or memory 216 may be used to buffer incoming data as well as store data structures such as, e.g., a forwarding database, and/or routing tables that include primary and secondary path information, path cost values, and so forth.

In one embodiment, the MPU 210 implements procedures for processing IP packets transmitted or received as payload data by the network interface 200. The procedures for processing the IP packets may include, without limitation, wireless routing, encryption, authentication, protocol translation, and routing between and among different wireless and wired network ports. In one embodiment, MPU 210 implements the techniques performed by the node when MPU 210 executes a firmware program stored in memory within network interface 200.

The MPU 214 is coupled to DAC 220 and DAC 221. Each DAC 220, 221 is configured to convert a stream of outbound digital values into a corresponding analog signal. The outbound digital values are computed by the signal processing procedures for modulating one or more channels. The DSP 214 is also coupled to ADC 222 and ADC 223. Each ADC 222, 223 is configured to sample and quantize an analog signal to generate a stream of inbound digital values. The inbound digital values are processed by the signal processing procedures to demodulate and extract payload data from the inbound digital values.

In one embodiment, MPU 210 and/or DSP 214 are configured to buffer incoming data within memory 212 and/or memory 216. The incoming data may be buffered in any technically feasible format, including, for example, raw soft bits from individual channels, demodulated bits, raw ADC samples, and so forth. MPU 210 and/or DSP 214 may buffer within memory 212 and/or memory 216 any portion of data received across the set of channels from which antenna 246 receives data, including all such data. MPU 210 and/or DSP 214 may then perform various operations with the buffered data, including demodulation operations, decoding operations, and so forth.

MPU 210, DSP 214, and potentially other elements included in network interface 200 are powered by power system 250, as described in greater detail below in conjunction with FIGS. 3-5. Power system 250 includes a higher voltage primary cell, such as a Lithium Thionyl Chloride (LTC) battery, and a lower voltage secondary cell, such as a Lithium Ion (Li-ion) battery. Power system 250 also includes a battery controller that charges the secondary cell with a constant current that is derived from the primary cell. During charging of the secondary cell, the battery controller outputs a charging signal to accumulator 252. Accumulator 252 records the activity of the charging signal over time to generate charging data. For example, accumulator 252 could record the total amount of time that the charging signal is active. Accumulator 252 transmits the charging data to MPU 210, and MPU 210 may then report this data upstream to server 154. MPU 210 may also process the charging data to determine a battery depletion level and/or a date and time of complete battery depletion. MPU 210 may then report this data to server 154. In one embodiment, MPU 210 includes a software implementation of accumulator 252.

One advantage of the above approach is that based on the charging data, a service technician can accurately determine when a given node 130 will need replacement batteries, thereby allowing the technician to minimize node downtime and minimize truck rolls.

Persons having ordinary skill in the art will recognize that network interface 200 represents just one possible network interface that may be implemented within wireless mesh network 102 shown in FIG. 1, and that any other technically feasible device for transmitting and receiving data may be incorporated within any of the nodes within wireless mesh network 102.

Measuring Battery Depletion in Battery-Powered Nodes

Figure 3:
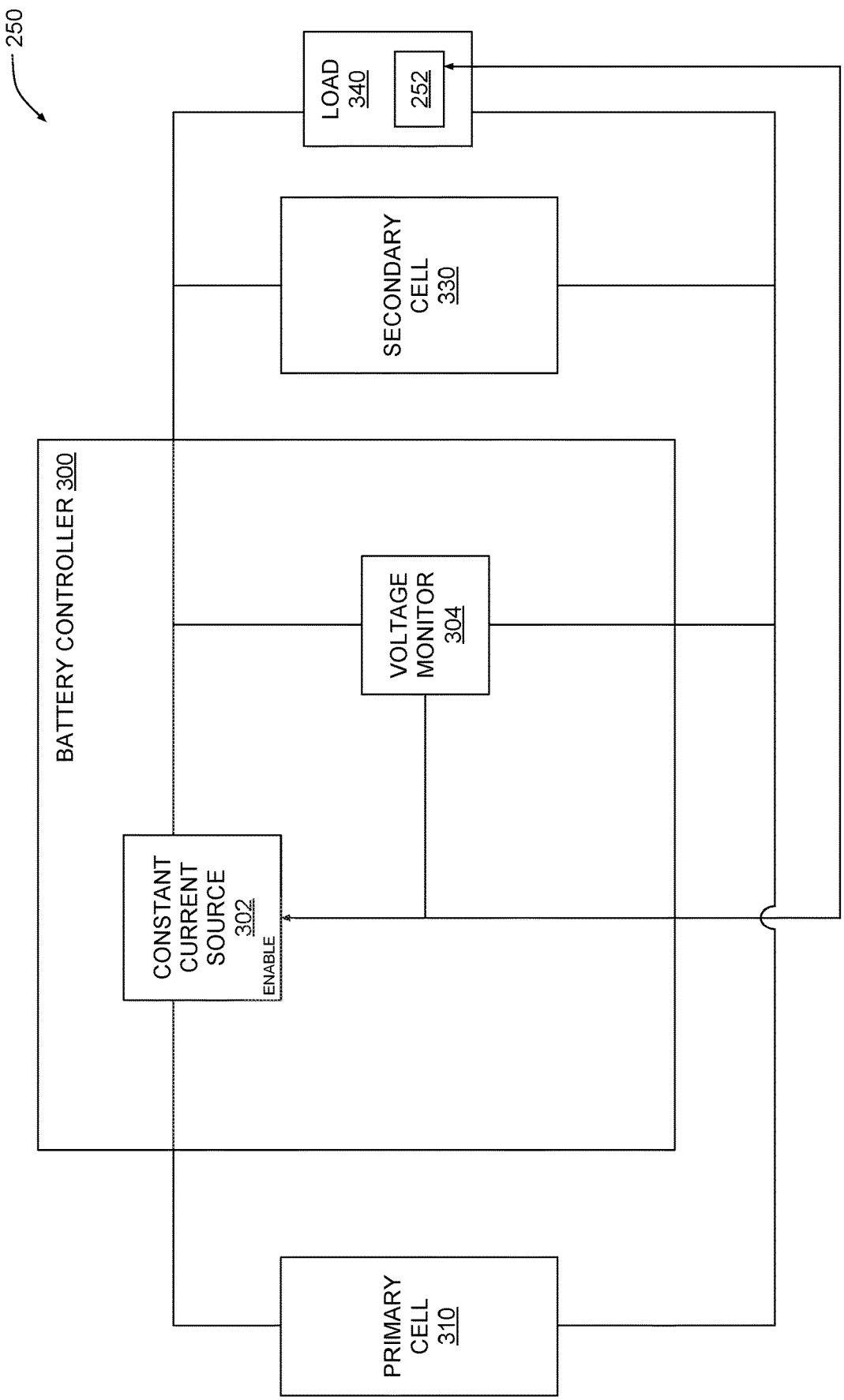
FIG. 3 is a more detailed illustration of the power system of FIG. 2, according to various embodiments of the present invention.

FIG. 3 is a more detailed illustration of the power system of FIG. 2, according to various embodiments of the present invention. As shown, power system 250 includes a battery controller 300 coupled between a primary cell 310 and a secondary cell 330. Battery controller 300 includes a constant current source 302 and a voltage monitor 304.

Primary cell 310 may deliver charge at greater than 3.6 Volts and may be a lithium thionyl chloride (LTC) battery. Secondary cell 330 generally delivers charge at less than 3.6 Volts, and may be a lithium ion (Li-ion) battery. Secondary cell 330 powers load 340. Secondary cell 330 may have a low impedance, thereby allowing load 340 to draw power across a wide range of currents during a short time scale. Load 340 may include some or all elements included in network interface 200 of FIG. 2, such as accumulator 252, as is shown. The maximum operating voltage of load 340 may be less than 3.6 Volts.

In operation, voltage monitor 304 monitors a voltage level associated with secondary cell 330 and then toggles a charging signal when that voltage level reaches specific thresholds. In particular, when the voltage level of secondary cell 330 decreases to less than a minimum voltage level, voltage monitor 304 activates the charging signal. When the voltage level of secondary cell 330 increases to greater than a maximum voltage level, voltage monitor 304 deactivates the charging signal. The minimum and maximum threshold values may be derived from characteristics of load 340, such as minimum and maximum operating voltages.

When the charging signal is active, constant current source 302 is enabled and draws electrical energy from primary cell 310. Constant current source 302 transmits this electrical energy to secondary cell 330 at a constant (and potentially fixed) current level, thereby charging secondary cell 330. Accumulator 252 records the activity of charging signal over time to generate charging data. When the charging signal is not active, constant current source 302 is not enabled and does not draw electrical energy from primary cell 310. Accumulator 252 may record that the charging signal is not active or may stop recording data. Load 340 may continue to draw electrical energy from secondary cell 330. When the voltage level associated with secondary cell 330 decreases beneath the minimum voltage level, charging may commence again, and the charging signal may be reactivated.

With the configuration of cells discussed herein, depletion of primary cell 310 can be accurately determined based on the charging signal because electrical energy is drawn from that cell at a specific, constant current level. For example, the constant current level could be multiplied by the total charging time to compute the total number of Amp Seconds drawn from primary cell 310. Based on this data and based on an initial charge capacity of primary cell 310, the depletion level of primary cell 310 at any given time can be determined. Further, because the electrical energy drawn from primary cell 310 is subsequently stored in secondary cell 330, load 340 may draw power from secondary cell 330 across a wide range of current levels. Accordingly, the disclosed approach resolves a specific technical issue associated with conventional battery monitors that cannot accurately measure battery depletion in battery-powered nodes that draw power across a wide range of current levels.

Persons skilled in the art will recognize that the above-described technique for charging secondary cell 330 via primary cell 310 confers important advantages apart from the ability to accurately measure battery depletion. In particular, primary cell 310 may be a higher voltage battery (such as an LTC battery) that delivers electrical energy at a voltage exceeding the maximum operating voltage of load 340. Although this type of battery may have an extended lifetime, integrated circuitry within a conventional battery-powered node would be damaged by these higher voltage levels.

With the approach described above, though, primary cell 310 may be electrically isolated from load 340 and only used to charge secondary cell 330. Secondary cell 330, in turn, may provide electrical energy to load 340 at a voltage that does not exceed the maximum operating voltage of load 340. Accordingly, the disclosed approach allows a higher voltage battery with an extended lifespan to power lower voltage circuitry such as network interface 200.

Figure 4:
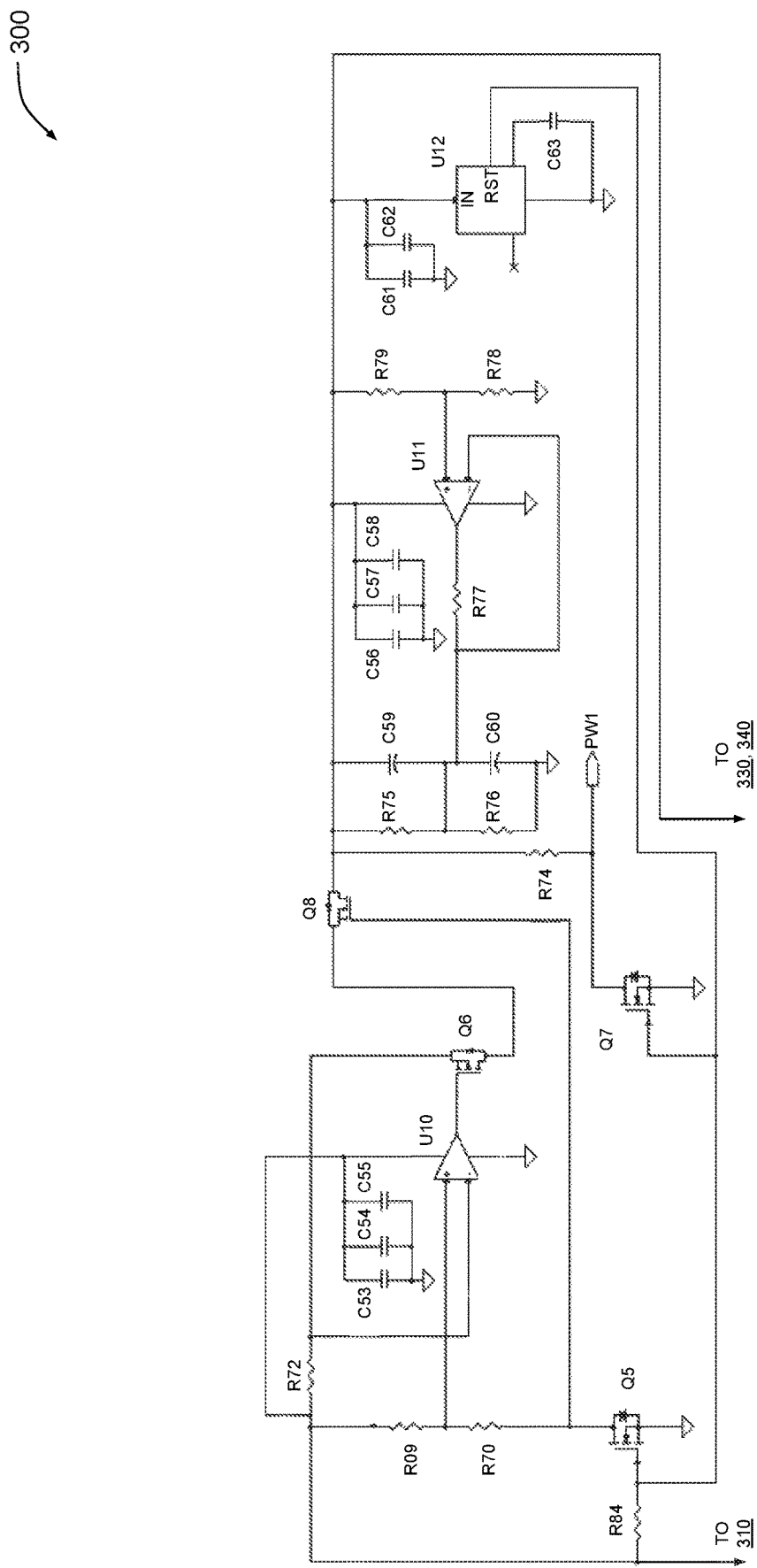
FIG. 4 illustrates an exemplary implementation of the power system of FIG. 3, according to various embodiments of the present invention.

FIG. 4 illustrates an exemplary implementation of the power system of FIG. 3, according to various embodiments of the present invention. As shown, battery controller 300 includes numerous electronic elements coupled together and coupled to primary cell 310, secondary cell 330, and load 340. Certain elements shown can be used to implement constant current source 302 and voltage monitor 304 discussed above in conjunction with FIG. 3.

Constant current source 302 may be implemented using operational amplifier (op-amp) U10. Op-amp U10 senses current through resistor R72 and controls current flowing through metal-oxide-semiconductor field-effect transistor (MOSFET) Q6. The current flowing through MOSFET Q6 can be modified by adjusting the resistance of resistor R69. Persons skilled in the art will understand that any of the other elements shown in FIG. 4 may be included in constant current source 302.

Voltage monitor 304 may be implemented using a comparator U12 or any other type of low power device with a voltage reference than can be used to control the charge voltage on another device. Comparator U12 may have built-in hysteresis to limit the rate of current fluctuations. In one embodiment, comparator U12 may output the charging signal to accumulator 252 as PW1.

In operation, comparator U12 monitors the voltage across secondary cell 330 and then transmits the charging signal when that voltage decreases beneath a minimum threshold value. In response, MOSFET Q6 interoperates with MOSFET Q8 to electrically couple primary cell 310 to secondary cell 330, thereby charging secondary cell 330 with electrical energy derived from primary cell 310 at a constant current level. Subsequently, when the voltage across secondary cell 330 increases to exceed the maximum voltage, comparator U12 disables the charging signal, thereby causing MOSFETs Q6 and Q8 to electrically decouple secondary cell 330 from primary cell 310.

As mentioned, the circuit shown in FIG. 4 is provided for exemplary purposes to illustrate one possible implementation of battery controller 300. Other implementations also fall within the scope of the various embodiments. The techniques performed via battery controller 300 are described in stepwise fashion below in conjunction with FIG. 5.

Figure 5:
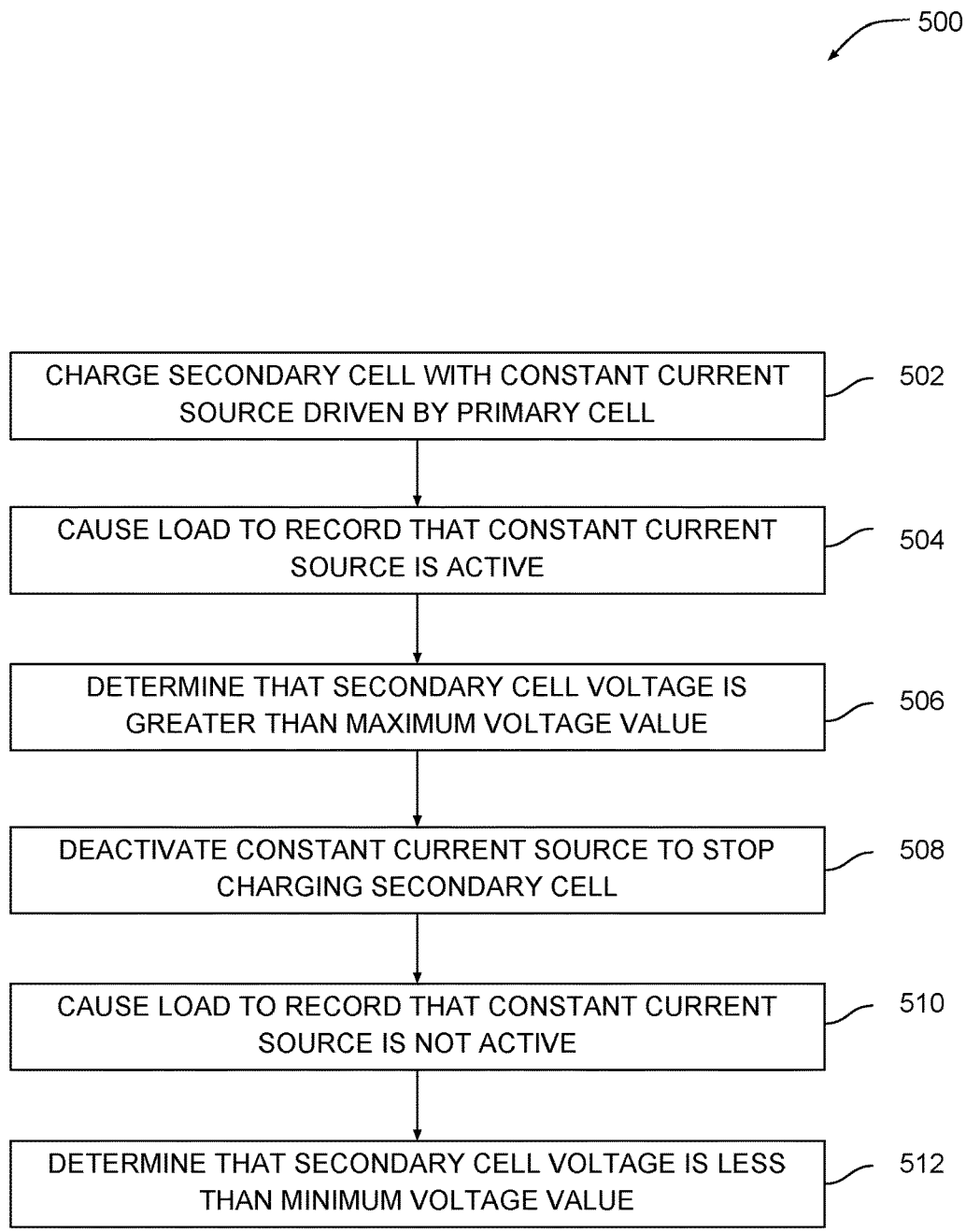
FIG. 5 is a flow diagram of method steps for determining battery depletion within a battery-powered node, according to various embodiments of the present invention.

FIG. 5 is a flow diagram of method steps for monitoring battery depletion within a battery-powered node, according to various embodiments of the present invention. Although the method steps are described in conjunction with the systems of FIGS. 1-4, persons skilled in the art will understand that any system configured to perform the method steps, in any order, is within the scope of the present invention.

As shown, a method 500 begins at step 502, where battery controller 300 charges secondary cell 330 with constant current source 302 driven by primary cell 310. Primary cell 310 may provide a voltage that exceeds the maximum operating voltage of load 340. At step 504, battery controller 300 causes load 340 to record that constant current source 302 is active and depleting energy stored by primary cell 310. In performing step 504, battery controller 300 transmits the charging signal to load 340. At step 506, battery controller 300 determines that the voltage of secondary cell 330 is greater than a maximum voltage value. The maximum voltage value may be derived from the maximum load voltage associated with load 340.

At step 508, battery controller 300 deactivates constant current source 302 to stop charging secondary cell 330. At step 510, battery controller 300 causes load 340 to record that constant current source 302 is not active and not depleting energy stored by primary cell 310. In performing step 510, battery controller 300 stops transmitting the charging signal to load 340. At step, 512 battery controller 300 determines that the voltage of secondary cell 330 is less than a minimum voltage value. The minimum voltage value may be derived from the minimum load voltage associated with load 340. The method may then return to step 502 and repeat.

By implementing the method 500, battery controller 300 is capable of causing a battery-powered node to record precise consumption data that reflects an amount of energy depleted from batteries during node operations. The battery-powered node may also compute an estimated date and time when batteries will deplete entirely, potentially leading to node deactivation. The battery-powered node may provide this data to server 154 in response to a query. By querying many battery-powered nodes in this manner, server 154 may determine a subset of those nodes that may soon lose power due to battery depletion. One or more service technicians can then be scheduled to replace the batteries in those nodes, thereby maintaining network stability.

In sum, a battery-powered node draws power from a power system. The power system includes a primary cell and a secondary cell managed by a battery controller. The battery controller includes a constant current source that draws power from the primary cell to charge the secondary cell. The secondary cell powers the battery-powered node across a wide range of current levels. When the voltage of the secondary cell drops beneath a minimum voltage level, the constant current source charges the secondary cell and a charging signal is sent to the battery-powered node. When the voltage of the second cell exceeds a maximum voltage level, the constant current source stops charging the secondary cell and the charging signal is terminated. The battery-powered node records the amount of time the charging signal is active and then determines a battery depletion level based on that amount of time. The battery-powered node reports the depletion level across the network, thereby allowing battery replacement to be efficiently scheduled.

One advantage of the techniques described herein is that the battery controller can reliably indicate battery depletion in battery-powered nodes with extended operational lifetimes. Accordingly, the need to replace the batteries in a given battery-powered node can be predicted with precision. With such precision, service technicians can more effectively schedule battery replacements in a manner that minimizes node downtime and minimizes truck rolls. Another advantage of the techniques described herein is that the battery controller consumes minimal power and therefore does not significantly reduce the operational lifespan of the battery powered node. For at least these reasons, the disclosed approach represents a significant technical advancement relative to prior art solutions.

1. Some embodiments include a computer-implemented method for determining battery depletion in a battery-powered node residing within a wireless mesh network, the method comprising: determining that a first voltage level associated with a secondary cell is less than a minimum voltage level, in response, activating a charging signal, conducting first electrical energy from a primary cell to the secondary cell at a constant current level in response to the charging signal, wherein the battery-powered node draws second electrical energy from the secondary cell, and causing the battery-powered node to record a first amount of time for which the charging signal is active, wherein the first amount of time indicates a first amount of battery power stored in the primary cell.

2. The computer-implemented method of clause 1, wherein the minimum voltage level corresponds to a minimum operating voltage associated with the battery-powered node.

3. The computer-implemented method of any of clauses 1 and 2, further comprising: determining that a second voltage level associated with the secondary cell is greater than a maximum voltage level, in response, deactivating the charging signal, electrically isolating the primary cell from the secondary cell once the charging signal is deactivated, and causing the battery powered node to not record any information about the charging signal.

4. The computer-implemented method of any of clauses 1, 2, and 3, wherein the maximum voltage level corresponds to a maximum operating voltage associated with the battery-powered node.

5. The computer-implemented method of any of clauses 1, 2, 3, and 4, wherein conducting the first electrical energy from the primary cell to the secondary cell comprises enabling, via the charging signal, a constant current source coupled between the primary cell and the secondary cell.

6. The computer-implemented method of any of clauses 1, 2, 3, 4, and 5, wherein the primary cell comprises a lithium thionyl chloride battery that outputs electrical energy with a voltage level that is greater than a maximum operating voltage associated with the battery-powered node.

7. The computer-implemented method of any of clauses 1, 2, 3, 4, 5, and 6, wherein the secondary cell comprises a lithium ion battery that outputs electrical energy with a voltage level that is less than a maximum operating voltage associated with the battery-powered node.

8. The computer-implemented method of any of clauses 1, 2, 3, 4, 5, 6, and 7, further comprising reporting the first amount of battery power to a server machine configured to manage the wireless mesh network.

9. The computer-implemented method of any of clauses 1, 2, 3, 4, 5, 6, 7, and 8, further comprising computing an estimated date and time when the first primary cell will be depleted based on the first amount of time and reports the estimated date and time to a server machine configured to manage the wireless mesh network.

10. The computer-implemented method of any of clauses 1, 2, 3, 4, 5, 6, 7, 8, and 9, further comprising drawing the second electrical energy from the secondary cell to perform wireless communications with one or more other nodes residing in the wireless mesh network.

11. Some embodiments include a system for determining battery depletion in a battery-powered node residing within a wireless mesh network, comprising: a voltage monitor that: determines that a first voltage level associated with a secondary cell is less than a minimum voltage level, in response, activates a charging signal, and causes the battery-powered node to record a first amount of time for which the charging signal is active, wherein the first amount of time indicates a first amount of battery power stored in a primary cell, and a constant current source that conducts first electrical energy from the primary cell to the secondary cell in response to the charging signal, wherein the battery-powered node draws second electrical energy from the secondary cell.

12. The system of clause 11, wherein the minimum voltage level corresponds to a minimum operating voltage associated with the battery-powered node.

13. The system of any of clauses 11 and 12, wherein the voltage monitor determines that a second voltage level associated with the secondary cell is greater than a maximum voltage level and, in response, deactivates the charging signal.

14. The system of any of clauses 11, 12, and 13, wherein the constant current source electrically isolates the primary cell from the secondary cell once the charging signal is deactivated, wherein the battery powered node does not record any information about the charging signal when the charging signal is deactivated.

15. The system of any of clauses 11, 12, 13, and 14, wherein the maximum voltage level corresponds to a maximum operating voltage associated with the battery-powered node.

16. The system of any of clauses 11, 12, 13, 14, and 15, wherein the primary cell comprises a lithium thionyl chloride battery that outputs electrical energy with a voltage level that is greater than a maximum operating voltage associated with the battery-powered node, and wherein the secondary cell comprises a lithium ion battery that outputs electrical energy with a voltage level that is less than the maximum operating voltage associated with the battery-powered node.

17. The system of any of clauses 11, 12, 13, 14, 15, and 16, wherein the battery-powered node computes an estimated date and time when the first primary cell will be depleted based on the first amount of time and reports the estimated date and time to a server machine configured to manage the wireless mesh network.

18. The system of any of clauses 11, 12, 13, 14, 15, 16, and 17, wherein the battery-powered node draws the second electrical energy from the secondary cell to perform wireless communications with one or more other nodes residing in the wireless mesh network.

19. The system of any of clauses 11, 12, 13, 14, 15, 16, 17, and 18, wherein the battery-powered node activates during a first recurring time period to perform the wireless communications with the one or more other nodes, and wherein the battery-powered node draws the second electrical energy from the secondary cell across a first range of current levels during the first recurring time period.

20. The system of any of clauses 11, 12, 13, 14, 15, 16, 17, 18, and 19, wherein the primary cell cannot output electrical energy across the first range of current levels during the first recurring time period.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. A computer-implemented method for determining battery depletion in a battery-powered node residing within a wireless mesh network, the method comprising:
   determining that a first voltage level associated with a secondary cell is less than a minimum voltage level,
   in response, activating a charging signal;
   conducting first electrical energy from a primary cell to the secondary cell at a constant current level in response to the charging signal, wherein the battery-powered node draws second electrical energy from the secondary cell; and
   causing the battery-powered node to record a first amount of time for which the charging signal is active, wherein the first amount of time indicates a first amount of battery power stored in the primary cell.

2. The computer-implemented method of claim 1, wherein the minimum voltage level corresponds to a minimum operating voltage associated with the battery-powered node.

3. The computer-implemented method of claim 1, further comprising:
   determining that a second voltage level associated with the secondary cell is greater than a maximum voltage level;
   in response, deactivating the charging signal;
   electrically isolating the primary cell from the secondary cell once the charging signal is deactivated; and
   causing the battery powered node to not record any information about the charging signal.

4. The computer-implemented method of claim 3, wherein the maximum voltage level corresponds to a maximum operating voltage associated with the battery-powered node.

5. The computer-implemented method of claim 1, wherein conducting the first electrical energy from the primary cell to the secondary cell comprises enabling, via the charging signal, a constant current source coupled between the primary cell and the secondary cell.

6. The computer-implemented method of claim 1, wherein the primary cell comprises a lithium thionyl chloride battery that outputs electrical energy with a voltage level that is greater than a maximum operating voltage associated with the battery-powered node.

7. The computer-implemented method of claim 1, wherein the secondary cell comprises a lithium ion battery that outputs electrical energy with a voltage level that is less than a maximum operating voltage associated with the battery-powered node.

8. The computer-implemented method of claim 1, further comprising reporting the first amount of battery power to a server machine configured to manage the wireless mesh network.

9. The computer-implemented method of claim 1, further comprising computing an estimated date and time when the first primary cell will be depleted based on the first amount of time and reports the estimated date and time to a server machine configured to manage the wireless mesh network.

10. The computer-implemented method of claim 1, further comprising drawing the second electrical energy from the secondary cell to perform wireless communications with one or more other nodes residing in the wireless mesh network.

11. A system for determining battery depletion in a battery-powered node residing within a wireless mesh network, comprising:
   a voltage monitor that:
      determines that a first voltage level associated with a secondary cell is less than a minimum voltage level,
      in response, activates a charging signal, and
      causes the battery-powered node to record a first amount of time for which the charging signal is active, wherein the first amount of time indicates a first amount of battery power stored in a primary cell; and
   a constant current source that conducts first electrical energy from the primary cell to the secondary cell in response to the charging signal, wherein the battery-powered node draws second electrical energy from the secondary cell.

12. The system of claim 11, wherein the minimum voltage level corresponds to a minimum operating voltage associated with the battery-powered node.

13. The system of claim 11, wherein the voltage monitor determines that a second voltage level associated with the secondary cell is greater than a maximum voltage level and, in response, deactivates the charging signal.

14. The system of claim 13, wherein the constant current source electrically isolates the primary cell from the secondary cell once the charging signal is deactivated, wherein the battery powered node does not record any information about the charging signal when the charging signal is deactivated.

15. The system of claim 13, wherein the maximum voltage level corresponds to a maximum operating voltage associated with the battery-powered node.

16. The system of claim 11, wherein the primary cell comprises a lithium thionyl chloride battery that outputs electrical energy with a voltage level that is greater than a maximum operating voltage associated with the battery-powered node, and wherein the secondary cell comprises a lithium ion battery that outputs electrical energy with a voltage level that is less than the maximum operating voltage associated with the battery-powered node.

17. The system of claim 11, wherein the battery-powered node computes an estimated date and time when the first primary cell will be depleted based on the first amount of time and reports the estimated date and time to a server machine configured to manage the wireless mesh network.

18. The system of claim 11, wherein the battery-powered node draws the second electrical energy from the secondary cell to perform wireless communications with one or more other nodes residing in the wireless mesh network.

19. The system of claim 11, wherein the battery-powered node activates during a first recurring time period to perform the wireless communications with the one or more other nodes, and wherein the battery-powered node draws the second electrical energy from the secondary cell across a first range of current levels during the first recurring time period.

20. The system of claim 19, wherein the primary cell cannot output electrical energy across the first range of current levels during the first recurring time period.

* * * * *